United States Patent [19]

Takahashi

[11] Patent Number: 4,763,007
[45] Date of Patent: Aug. 9, 1988

[54] IMAGE SENSOR DRIVING CIRCUIT

[75] Inventor: Junichi Takahashi, Tokyo, Japan

[73] Assignee: Ricoh Company, Ltd., Tokyo, Japan

[21] Appl. No.: 811,705

[22] Filed: Dec. 20, 1985

[30] Foreign Application Priority Data

Dec. 25, 1984 [JP] Japan .................. 59-279247
Dec. 25, 1984 [JP] Japan .................. 59-279248
Dec. 25, 1984 [JP] Japan .................. 59-279249

[51] Int. Cl.$^4$ ............................................ H03F 17/00
[52] U.S. Cl. .............................. 250/578; 358/213.11; 358/212; 357/75; 357/30
[58] Field of Search ............... 250/578, 214 R, 214 A; 358/213, 212, 213.27, 213.11; 330/107, 261, 260; 357/74, 75, 30 R, 30, 30 D

[56] References Cited

U.S. PATENT DOCUMENTS

| 4,079,422 | 3/1978 | Anagnostopoulos | 250/578 |
| 4,227,155 | 10/1980 | Lerma | 250/214 A |
| 4,288,841 | 9/1981 | Gogal | 357/75 |
| 4,354,162 | 10/1982 | Wright | 330/260 |
| 4,371,912 | 2/1983 | Guzik | 357/75 |
| 4,464,630 | 8/1984 | Eddins | 330/107 |
| 4,470,020 | 9/1984 | Mohr | 330/107 |
| 4,525,921 | 7/1985 | Carson et al. | 357/75 |

Primary Examiner—Edward P. Westin
Assistant Examiner—Charles Wieland
Attorney, Agent, or Firm—Cooper & Dunham

[57] ABSTRACT

An image sensor driving circuit of the matrix driving type includes a plurality of sensor elements for converting light image information into an electrical image signal, an operational amplifier circuit section for amplifying the electrical image signal and a logic circuit section for controlling the operation of the amplifier circuit section. In one embodiment, the amplifier circuit section includes a single stage operational amplifier having a pair of series-connected feed-back resistors and a trimmer capacitor connected between the interconnection between the feed-back resistors and ground, which allows to eliminate the differential signal component arising from the parasitic capacitance of the sensor element. In another embodiment, the operational amplifier is provided with an input offset compensation circuit which supplies a compensation voltage opposite in polarity to the input offset voltage of the operational amplifier, thereby preventing crosstalk from occurring. In a further embodiment, the image sensor includes an analog circuit section having an operational amplifier circuit and a logic circuit section which are mounted on separate substrates.

4 Claims, 6 Drawing Sheets

IMAGE SENSOR DRIVING CIRCUIT

BACKGROUND OF THE INVENTION

1. Field of the Invention

This invention relates to circuitry for driving an image sensor, and in particular, to an image sensor driving circuit utilizing the virtual ground of an operational amplifier for driving a plurality of photoelectric elements arranged in the form of an array selectively.

2. Description of the Prior Art

Figure 1:
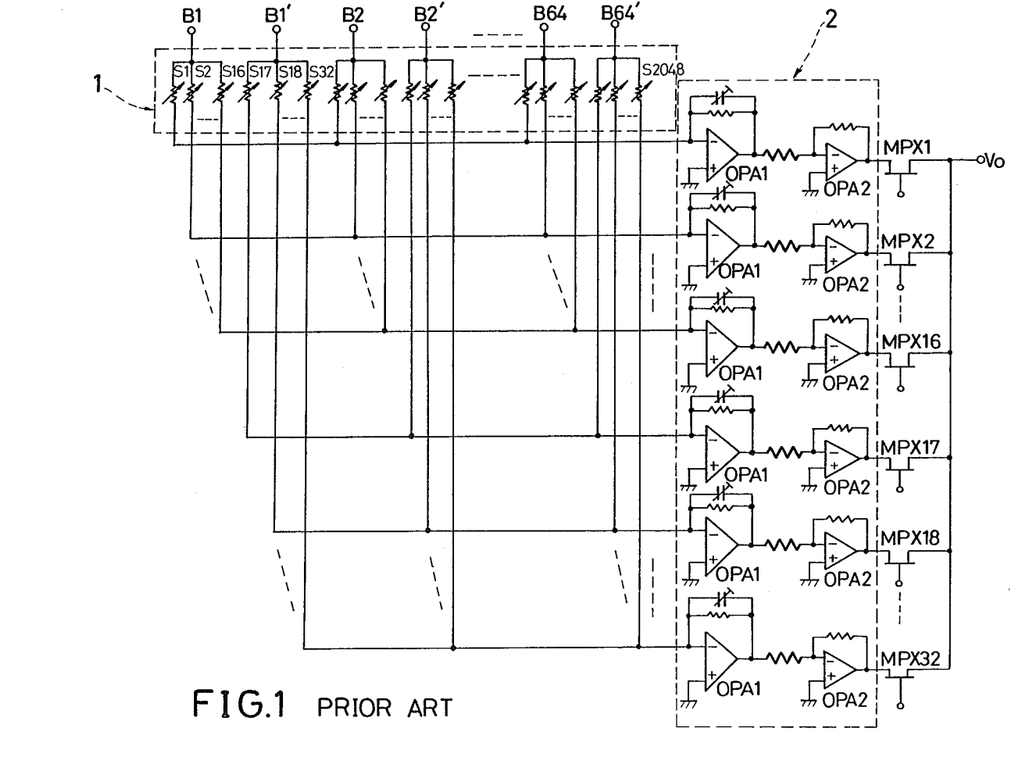
FIG. 1 is a circuit diagram showing as an example the typical prior art image sensor driving circuit of the matrix driving system.

As shown in FIG. 1, in facsimile machines or the like, use is made of a solid-state line sensor, typically in the form a CCD (Charge Coupled Device) structure, which includes a plurality of photoelectric elements S1 through S2,048 arranged in the form of a single line. These photoelectric elements are normally divided into a first plurality of blocks, each containing a predetermined number of photoelectric elements, and the plurality of photoelectric elements are activated block by block for reading an image along the main scanning line, which is defined by the one dimensional array of the plurality of photoelectric elements. In the example shown in FIG. 1, the total of 2,048 photoelectric elements are divided into 128 blocks, and those of the photoelectric elements which belong to the same block are commonly connected together at one end and also connected to the corresponding one of block common electrodes B1, B1'. B2, B2, . . . , B64, and B64'. An activation pulse or driving voltage is applied to the block common electrodes B1 through B64' sequentially one from another so that all of the photoelectric elements belonging to the same block are driven at the same time. In the illustrated example, each block contains sixteen photoelectric elements.

The line image sensor 1 having the total of 2,048 photoelectric elements arranged in the form of a single line and divided into 128 blocks is electrically connected through interconnection lines to an operational amplifier section 2 which includes 32 two-stage operational amplifier circuits. Each of the two-stage operational amplifier circuits includes a first stage operation amplifier OPA1 which has its inverting input terminal connected from the individual end of each of the corresponding photoelectric elements in alternate blocks and has its non-inverting input terminal connected to ground. This first stage operational amplifier OPA1 has its output terminal connected to the inverting input terminal through a feed-back circuit including a parallel connection of a capacitor and a resistor and also to an inverting input terminal of its associated second stage operational amplifier OPA2, which has its non-inverting input terminal connected to ground and its output connected to its inverting input terminal through a feed-back loop containing a resistor and also to device output terminal $V_0$ through a corresponding one of 32 MOS switches MPX1 through MPX32, which define a multiplexer.

With this structure, the switches MPX1 through MPX32 are turned on sequentially one after another while activating one of the blocks and this operation is repeated while activating another block. As a result, outputs from the plurality of photoelectric elements S1 through S2,048 are obtained in a timed sequence at the device output terminal $V_0$.

Figure 2:
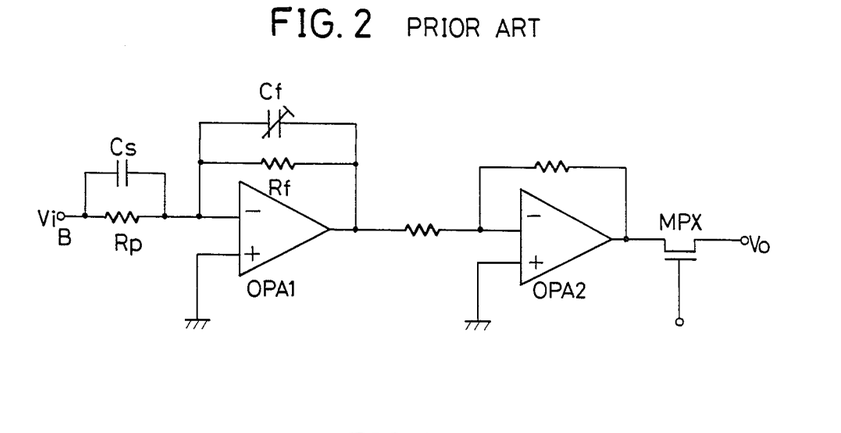
FIG. 2 is a circuit diagram showing the detailed structure of the two-stage operational amplifier circuit provided in the structure shown in FIG. 1.
Figure 3:
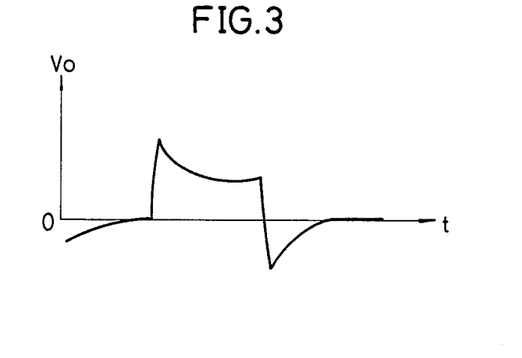
FIGS. 3 and 4 are graphs which are useful for explaining the effect obtained when the differential signal component in the output signal is compensated.
Figure 4:
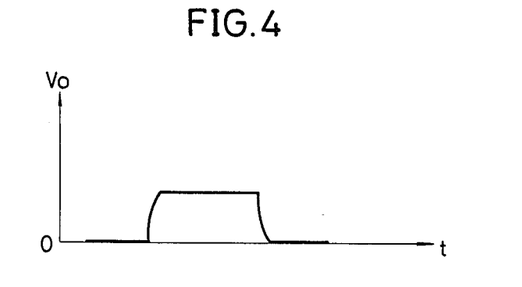

The detailed structure of the two-stage operational amplifier circuit is shown in FIG. 2. As indicated in FIG. 2, since the inverting input terminal of the first stage operational amplifier OPA1 is connected to receive an output signal from one of the photoelectric elements, which are typically comprised of amorphous-Si or the like, there is present a sensor resistance $R_p$ connected in series with the inverting input terminal of the first stage operational amplifier OPA1 and also a parasitic capacitance $C_s$ connected in parallel with the sensor resistance $R_p$. Accordingly, if a feed-back capacitor $C_f$ is not provided for the first stage operational amplifier OPA1, a differential signal is superimposed in the output voltage $V_0$ as shown in FIG. 3 and the rising time period for the differential signal can be as long as 20 micro-seconds, which could be a cause of noises. For this reason, it is normally the case to provide the feed-back capacitor $C_f$ to the first stage operational amplifier OPA1 so as to absorb such a differential signal by the feed-back capacitor $C_f$, thereby allowing to obtain a smoothed output voltage $V_0$ as shown in FIG. 4. The value of the feed-back capacitor $C_f$ may be determined by the relationship of $C_s \cdot R_p = C_f \cdot R_f$. Typically, it holds that $R_p = 100$ M-ohms and $C_s = 0.2$ pF and thus we obtain $C_f R_f = 20 \times 10^6$.

On the other hand, the level of input voltage to the analog multiplexer MPX must be set at 2 V or higher in order to prevent its output voltage from being adversely affected by its own noises, and, thus, if the driving voltage $V_i$ to be applied to the block common electrodes B is 12 V, then the resistance of the feed-back resistor $R_f$ of the operational amplifier OPA1 becomes large, i.e., in the order of 20 M-ohms. In this case, therefore, it is necessary to use the feed-back capcacitor $C_f$ having the capacitance in the order of 1 pF; however, it is rather difficult to obtain a trimmer capacitor in the order of 1 pF due to the problem of parasitic capacitance associated with an insulating material, such as PCB, used in mounting an IC chip. Furthermore, the feed-back capacitor $C_f$ is required to be capable of being finely adjusted for compensating the differential signal in consideration of the scatter in the parasitic capacitance $C_s$ among the photoelectric elements.

Under the circumstances, in accordance with the prior art, as shown in FIG. 2, the two-stage operational amplifier circuit including a series-connected operational amplifiers OPA1 and OPA2 is provided and the resistance of the feed-back resistor $R_f$ of the first stage operational amplifier OPA1 is set in the order of 1 M-ohms while using a trimmer capacitor having the capacitance in the vicinity of 20 pF as the feed-back capacitor $C_f$. The output voltage of the first stage operational amplifier OPA1 is further amplified by the second stage operational amplifier OPA2 thereby allowing to obtain a required level of output voltage. It is to be noted, however, that this prior art approach requires to provide a two-stage operational amplifier circuit, and, thus, it is rather complicated in structure, larger in size and can be a cause in lowering the yield.

SUMMARY OF THE INVENTION

It is therefore a primary object of the present invention to obviate the disadvantages of the prior art as described above and to provide an improved image sensor driving circuit.

Another object of the present invention is to provide an image sensor driving circuit simple in structure and thus easy to manufacture.

A further object of the present invention is to provide an improved image sensor driving circuit which has a matrix driving system for driving an one-dimensional image sensor comprised of a plurality of photoelectric elements arranged in the form of a single line and which utilizes the virtual ground of an operational amplifier.

A still further object of the present invention is to provide an improved image sensor driving circuit capable of compensating for a differential signal arising from each of photoelectric elements in an image sensor.

A still further object of the present invention is to provide an improved image sensor driving circuit capable of preventing the occurrence of crosstalk.

A still further object of the present invention is to provide an improved image sensor driving circuit which is virtually immune to noises and thus high in performance.

Other objects, advantages and novel features of the present invention will become apparent from the following detailed description of the invention when considered in conjunction with the accompanying drawings.

DESCRIPTION OF THE PREFERRED EMBODIMENTS

In accordance with one aspect of the present invention, there is provided a single-stage operational amplifier for amplifying an output voltage supplied from the corresponding one of a plurality of associated photoelectric elements. The operational amplifier includes a pair of series-connected feed-back resistors connected between its output terminal and its inverting input terminal and a trimmer capacitor having a relatively large capacitance and connected between the node between the pair of feed-back resistors and ground. Also provided is a feed-back capacitor connected in parallel with the pair of series-connected feed-back resistors.

Figure 5:
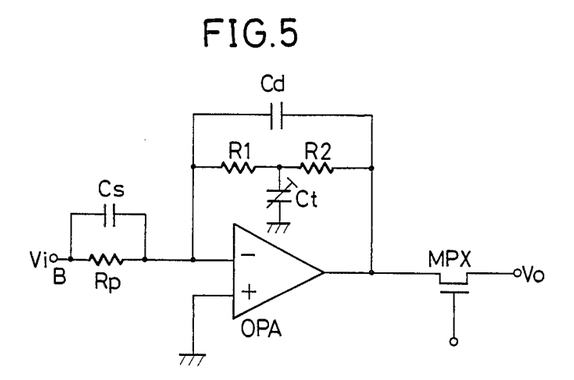
FIG. 5 is a circuit diagram showing part of an image sensor driving circuit constructed in accordance with one embodiment of the present invention.

Now, with reference to FIG. 5, this aspect of the present invention will be described in detail below. FIG. 5 shows the detailed structure of part of an amplifier section of an image sensor driving circuit of the matrix driving type, which utilizes the virtual ground of an operational amplifier. As shown, the amplifier section for amplifying an output from the corresponding one of a plurality of photoelectric elements includes only a single operational amplifier OPA which has its inverting input terminal connected to receive an output signal from the corresponding one of a plurality of photoelectric elements arranged in the form of a single line to define a line image sensor as shown in FIG. 1. In FIG. 5, since each of the photoelectric or sensor elements has a sensor series resistance $R_p$, this is schematically indicated as connected between the inverting input terminal of the operational amplifier OPA and the block common terminal B of the corresponding block. Also indicated as connected in parallel with the sensor series resistance $R_p$ is a parasitic capacitance $C_s$ present in the sensor element. On the other hand, the operational amplifier OPA has its non-inverting input terminal connected to ground and its output terminal connected to the device output terminal $V_0$ through an associated MOS switch MPX.

Of importance, in the structure shown in FIG. 5, there is provided a pair of series-connected feed-back resistors R1 and R2 as connected between the output and inverting input terminals of the operational amplifier OPA. Also provided is a trimmer capacitor $C_f$ which has its one plate connected to a node or interconnection between the pair of feed-back resistors R1 and R2 and its other plate connected to ground. In addition, a feed-back capacitor $C_d$ is connected in parallel with the pair of series-connected resistors R1 and R2. It should be noted that although only one operational amplifier is shown in FIG. 5, a predetermined number of such operational amplifiers are provided in parallel in an amplifier section of the present device.

Regarding the structure shown in FIG. 5, an equivalent feed-back impedance $Z_{ft}$ of the operational amplifier OPA may be expressed as follows:

$$Z_{ft} = \frac{1 + jwC_t \cdot R1R2/R1 + R2}{1 + jwC_d(R1 + R2) + (jw)^2 C_t C_d R1R2} \tag{1}$$

Thus, if the following relation holds, $$C_t \frac{R1R2}{R1 + R2} = C_d(R1 + R2) \tag{2}$$

then, the feed-back impedance $Z_{ft}$ becomes purely resistive as indicated below.

$$Z_{ft} = R1 + R2 \tag{3}$$

That is, the d.c. gain of the operational amplifier OPA can now be expressed by $(R1+R2)/R_p$. In this case, if it is desired to supply an input voltage in the order of 2 V or higher to the switch MPX with $R_p = 100$ M-ohms and $C_s = 0.2$ pF, it is required to set approximately such that $R1+R2=20$ M-ohms.

Accordingly, when set as R1=20 M-ohms, R2=1 M-ohms and $C_d = 1$ pF, we have the following relation from the above equation (2).

$$C_t = \frac{C_d(R1 + R2)^2}{R1R2} \cong 22.1 \text{ (pF)} \tag{4}$$

And, thus, it is understood that use can be made of a capacitor in the order of 20 pF, which is readily available in the market, as the trimmer capacitor $C_t$. In addition, with the use of such a trimmer capacitor $C_t$ having a relatively large capacitance, a relatively large margin can be provided against distributed capacitances when mounting on a circuit board in the form of an I.C. chip.

It is to be noted, however, that the condition indicated by the above equation (2) is a condition which makes the feed-back impedance of the operational amplifier OPA to be purely resistive equivalently. In reality, in order to sufficiently compensate for the parasitic capacitance $C_s$ of a sensor element, the value of the trimmer capacitor $C_t$ must be made somewhat smaller than the value obtained from the above equation (4). It has been found experimentally that preferred results are obtainable by selecting the trimmer capacitor $C_t$ whose capacitance is smaller than the value obtained from the above equation (4) by 10 or 20%.

As described above, in accordance with this aspect of the present invention, an output voltage of sufficient level can be obtained by a single operational amplifier while sufficiently compensating for the differential signal component resulting from the parasitic capacitance associated with the corresponding sensor element. This is advantageous not only because the structure is simplified, but also because the mounting density when mounted in the form of I.C. chips can be significantly enhanced.

Now, another aspect of the present invention will be described in detail below. This aspect of the present invention is particularly concerned with the compensation for crosstalk. In particular, this aspect of the present invention proposes to prevent crosstalk from taking place by compensating the input offset voltage of an operational amplifier used in an amplifier section of an image sensor driving circuit. In particular, in order to attain such objective, the present invention proposes to provide means for compensating for the input offset voltage of an operational amplifier, which is designed to prevent the occurrence of crosstalk by the virtual ground, by applying a voltage same in magnitude as but opposite in polarity to the input offset voltage of the operational amplifier. Such a structure allows to cancel out the input offset voltage at all times.

Figure 6:
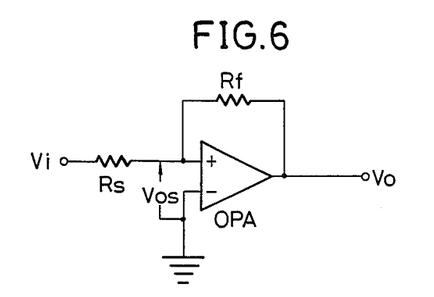
FIG. 6 is a circuit diagram showing how an input offset voltage is produced at the input terminals of an operational amplifier.

In the prior art two-stage structure shown in FIG. 2, the virtual ground at the input terminals of the first stage operational amplifier OPA1 is utilized to prevent the occurrence of crosstalk, i.e., preventing the output signal from one sensor element from being affected by the output signal from another sensor element. However, in reality, as shown in FIG. 6, since an input offset voltage $V_{os}$ is present between the inverting and non-inverting input terminals of the real operational amplifier OPA, the condition of virtual ground is often times destroyed, thereby producing crosstalk current. Typically, the offset voltage $V_{os}$ can be in the order of ±13 mV with the temperature ranging between 0° C. and 70° C. even if use is made of a high-performance operational amplifier for the operational amplifier OPA1 of FIG. 2.

Figure 7:
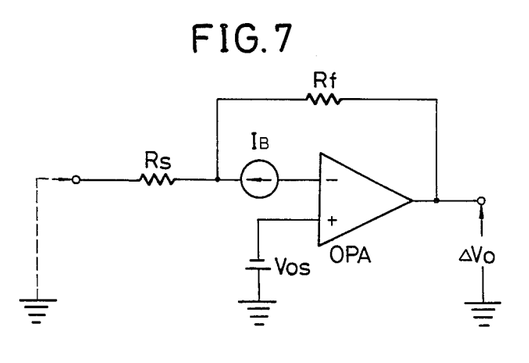
FIG. 7 is an equivalent circuit diagram of an operational amplifier when input offset and input bias voltages are taken into consideration.

FIG. 7 schematically shows an equivalent circuit of the operational amplifier OPA when both of input offset voltage $V_{os}$ and input bias voltage are taken into consideration. In this case, the operational amplifier OPA itself is assumed to be an ideal amplifier having no offset. It can be shown that the delta $V_0$ can be expressed by the following equation.

$$\text{delta } V_0 = (1 + R_f/R_s) \cdot V_{os} + R_f I_B \tag{5}$$

Figure 8:
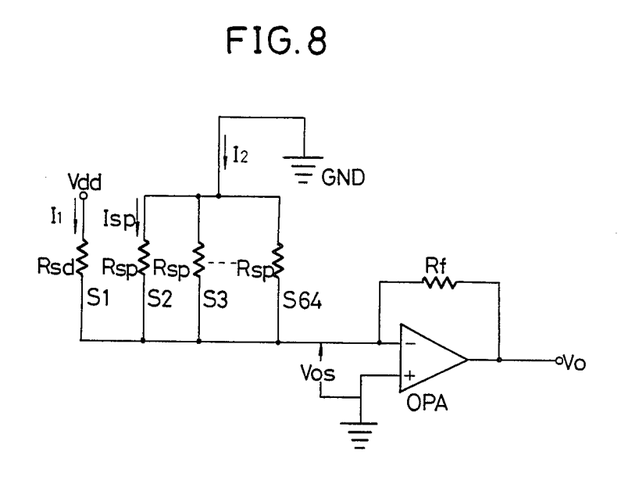
FIG. 8 is a circuit diagram showing how crosstalk current can be produced in an image sensor driving circuit.

Referring to FIG. 8, it will be described below the case where the crosstalk current due to the input offset voltage $V_{os}$ of an operational amplifier can be a problem. For this purpose, an assumption is made such that the inverting input terminal of the operational amplifier OPA is connected in parallel to sixty four sensor elements S1 through S64 and a driving voltage $V_{dd}$ is applied only to the first sensor element S1, which thus presents a sensor series resistance of $R_{sd}$, with the remaining sensor elements S2 through S64 presenting a sensor resistance of $R_{sp}$. Thus, the dark signal current $I_1$ which results when the image sensor $S_1$ is driven can be given by the following equation.

$$\begin{aligned} I_1 &= (V_{dd} - V_{os})/R_{sd} \\ &\cong V_{dd}/R_{sd} \end{aligned} \tag{6}$$

The above equation (6) results based on the fact that $V_{dd}$ is much larger in value than $V_{os}$ in absolute magnitude.

Since there are sixty three sensor resistances $R_{sp}$ connected in parallel between the inverting input terminal of the operational amplifier OPA and ground, we have their combined resistance $R = R_{sp}/63 = R_{sd}/6300$ assuming that $R_{sp} = R_{sd}/100$. Thus, the current $I_2$ which flows through the combined resistance R due to the input offset voltage $V_{os}$ of the operational amplifier OPA can be given by the following equation, supposing that ;i $V_{os} = -13$ mV.

$$I_2 = -V_{os}/R = -6{,}300 V_{os}/R_{sd} \cong 81.9/R_{sd} \tag{7}$$

If $V_{dd} = 12$ V, it results that $I_2 = 8.19$ nA while current $I_{sp} = 120$ nA flows through the sensor resistances $R_{sp}$, and, thus, the S/N ratio becomes very small as an image sensor. In order to minimize the effect of the current flowing through the combined resistance R by the input offset voltage $V_{os}$ of the operation amplifier OPA while making $I_1 = I_2$ in the worst case, $V_{dd}$ must be set at 80 V or higher from the relations (6) and (7) indicated above, but this is clearly not practical.

Figure 9:
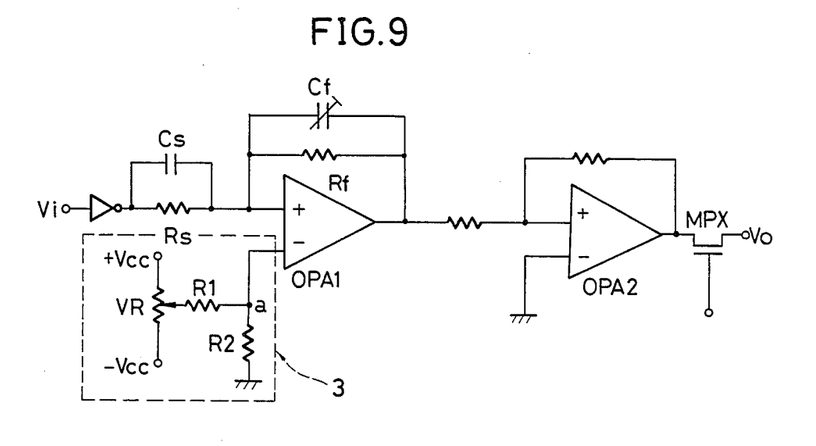
FIG. 9 is a circuit diagram showing part of an image sensor driving circuit constructed in accordance with another embodiment of the present invention.

Under the circumstances, this aspect of the present invention proposes to provide a structure shown in FIG. 9. As shown, the structure shown in FIG. 9 is similar to that of FIG. 2 excepting an input offset compensating circuit 3 indicated by the dotted line. The compensation circuit 3 is connected between the inverting input terminal of the operational amplifier OPA1 and ground, and, as will be described in detail below, it applies a voltage opposite in polarity to the input offset voltage $V_{os}$ of the operational amplifier OPA1 to the inverting input terminal of the amplifier OPA1 so as to cancel out the input offset voltage $V_{os}$. The input offset voltage compensation circuit 3 includes a pair of fixed resistors R1 and R2 and a variable resistor VR, wherein the resistors R1 and R2 are commonly connected at one end to a node a which is connected to the inverting input terminal of the operational amplifier OPA1. The resistor R2 has its other end connected to ground, and the resistor R1 has its other end connected to a variable tap of the variable resistor VR which is connected between positive and negative supply voltages $+V_{cc}$ and $-V_{cc}$. With this structure, depending on whether the input offset voltage $V_{os}$ is positive or negative, the voltage at the node a can be variably set to be positive or negative by the variable resistor VR. As an example, if it is so set that $V_{cc}=12$ V, VR=50 K-ohms, R1=220 K-ohms and R2=300 ohms, then the voltage at the node a can be adjusted in a range between $-12$ mV and $+12$ mV. The compensation for the input offset voltage $V_{os}$ by the compensation circuit 3 can be effected, for example, by adjusting the variable resistor VR such that the output voltage of the operational amplifier OPA1 is substantially zero when the input side of the sensor resistance $R_s$ is connected to ground.

With the provision of such an input offset compensating circuit 3 for compensating for the input offset voltage $V_{os}$ of the operational amplifier OPA1, the current $I_1$ is maintained to be substantially equal to the current $I_2$ so that crosstalk can be effectively prevented from occurring. Specifically, in the case of $V_{dd}=12$ V, $R_{sp}=100$ M-ohms and $R_{sd}=10,000$ M-ohms, by reducing the input offset voltage $V_{os}$ of the operational amplifier OPA from 13 mV to the order of 1 mV, we have $I_1=1.2$ nA and $I_2=0.63$ nA so that the problem of crosstalk is effectively obviated.

In general, in order to compensate for the input offset voltage of an operational amplifier in the form of an I.C. chip, a compensating voltage is applied to its offset terminal, and an I.C. chip having such an offset terminal usually contains only one operational amplifier per package. In order to provide the structure as shown in FIG. 1, it is necessary to use quad-packages containing four I.C. circuits in order to increase the mounting density; however, such a quad-package is not provided with an offset terminal. Thus, to use the structure shown in FIG. 9 for compensating for the input offset voltage of an operational amplifier in an image sensor driving circuit is most preferable.

Now, a further aspect of the present invention directed to decrease the noise which is introduced from a logic circuit section to an analog circuit section in an image sensor driving circuit of the matrix driving type will be described in detail below. In order to attain such an objective, in accordance with this aspect of the present invention, the image sensor driving circuit is so structured that its logic and analog circuit sections are mounted on separate substrates.

Figure 10:
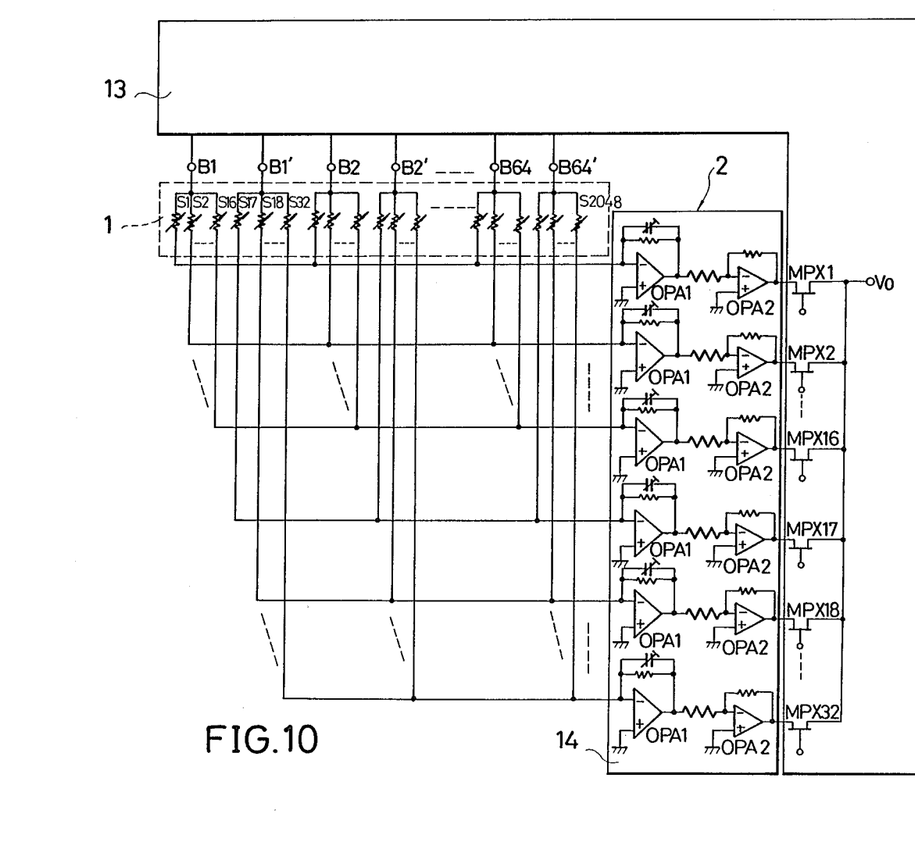
FIG. 10 is a circuit diagram showing an image sensor driving circuit constructed in accordance with a further embodiment of the present invention.

Referring now to FIG. 10, there is shown an image sensor driving circuit constructed in accordance with one embodiment of this aspect of this invention. As shown, the line image sensor 1 includes a plurality of photoelectric or sensor elements S1 through S2,048 which are arranged as spaced apart from one another at a predetermined pitch in a single line. The sensor elements S1 through S2,048 are divided into a first plurality of blocks B, each of which has a predetermined number of sensor elements as commonly connected at one end, which, in turn, is connected to the corresponding block common electrode B. Each of the sensor element has its individual electrode connected to the inverting input terminal of the corresponding one of a plurality of operational amplifiers OPA1 and also to the individual electrode of the corresponding sensor element in each of alternate blocks. For this purpose, a matrix interconnection line system is provided between the line image sensor 1 and the operational amplifier circuit section 2, which includes a predetermined number of two-stage amplifier circuits whose output terminals are connected to the device output terminal $V_0$ through respective MOS switches MPX, defining a mulltiplexer.

With this structure, a driving voltage is sequentially applied to the block common electrodes B1 through B64' in a predetermined order, such as from one end to the other, and, at the same time, the switches MPX1 through MPX 32 are sequentially turned on during a time period in which the driving signal is being applied to one of the block common electrodes B1 through B64'. By so doing, outputs from the plurality of sensor elements S1 through S2,048 are output in timed sequence as a serial data at the device output terminal $V_0$. In this case, each of the outputs from the sensor elements S1 through S2,048 are suitably amplified by the operational amplifier circuit section 2, which defines an analog circuit section of the structure shown in FIG. 10. Importantly, in accordance with the feature of this aspect of the present invention, the analog circuit section 14 of the operational amplifier circuit is mounted on its own analog circuit substrate 14. On the other hand, the switches MPX1 through MPX32 and other components (not shown) which define a logic circuit section for controlling the matrix driving operation are mounted on its own logic circuit substrate 13, which is thus separate from the analog circuit substrate 14.

Figure 11:
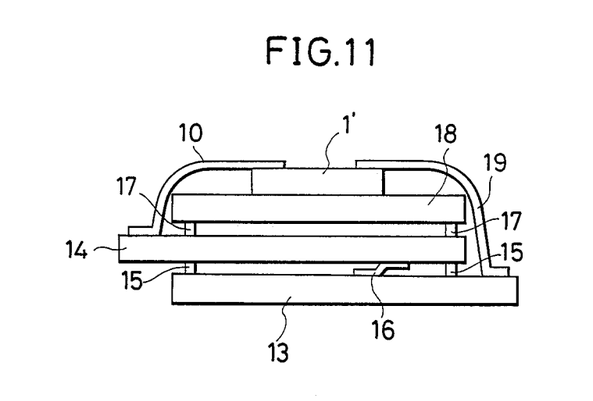
FIG. 11 is a schematic illustration showing an example of mounting structure embodying the present invention.

FIG. 11 shows one example of a specific mounting structure of the image sensor driving circuit embodying the present invention. In the illustrated structure, the analog circuit substrate 14 is placed on the logic circuit substrate 13 with spacers 15 sandwiched therebetween, and a flexible tape connector 16 is provided so as to establish an electrical connection between the analog circuit on the analog circuit substrate 14 and the logic circuit on the logic circuit substrate 13. In addition, on the analog circuit substrate 14 is placed a support plate 18 for supporting thereon a line image sensor substrate 1' with spacers 17 sandwiched between the substrates 14 and 18. The one dimensional array comprised of a plurality of sensor elements is fored at the top surface of the line image sensor substrate 1'. Also provided is a common flexible tape connector 19 for establishing an electrical connection between the block common electrodes of the sensor elements formed on the line image sensor substrate 1' and the logic circuit substrate 13 and an individual flexible tape connector 10 for establishing an electrical connection between the individual electrodes of the sensor elements formed on the line image sensor substrate 1' and the analog circuit substrate 14.

In the case when noises are introduced from the logic circuit section to the analog circuit section, it is the input terminals of the operational amplifier circuit section 2 that receive significant influences. That is, if noises are introduced at the input terminals of the operational amplifier circuit section 2, they are amplified and superimposed on an image signal. In view of this, the analog circuit substrate 14 on which the input terminals of the operational amplifier circuit section 2 are provided is made separate from the logic circuit substrate 13, and only the output terminal of the operational amplifier circuit section 2 are electrically connected to the logic circuit on the logic circuit substrate 13 through the flexible tape connector 16. In this case, noise current from the logic circuit section on the substrate 13 will flow to the output terminals of the operational amplifier circuit section 2; however, the output side of the operational amplifier circuit section 2 is small in resistance and the noise is not amplified so that the ratio of output image signal to noise current, i.e., S/N ratio, remains relatively large, and, thus, no particular problem arises.

Although, in the above-described embodiment, the support plate 18 and the two substrates 13 and 14 are mounted so as to be separated from one another vertically by means of spacers, they may be arranged in any other desired manner.

While the above provides a full and complete disclosure of the preferred embodiments of the present invention, various modifications, alternate constructions and equivalents may be employed without departing from the true spirit and scope of the invention. Therefore, the above description and illustration should not be construed as limiting the scope of the invention, which is defined by the appended claims.

What is claimed is:

1. An image sensing device comprising:
    a plurality of sensor elements arranged in the form of an array for converting light image information into an electrical image signal;
    analog circuit means coupled with said array for receiving said electrical image signal and applying a predetermined analog function to said electrical image signal to thereby generate an output signal;
    logic circuit means electrically connected to said analog circuit means for controlling the operation of said analog circuit means; and
    wherein said analog circuit means is mounted on a first substrate and said logic circuit means is mounted on a second substrate which is separate from said first substrate.

2. The device of claim 1 further comprising a third substrate on which said plurality of sensor elements are formed, said third substrate being separate from each of said first and second substrates.

3. The device of claim 2 wherein said first, second and third substrates are mounted one on top of another as spaced from each other by means of spacers.

4. The device of claim 1 wherein said analog circuit means includes an operational amplifier circuit for amplifying said electrical image signal.

* * * * *